United States Patent
Martin et al.

(10) Patent No.: US 7,383,480 B2
(45) Date of Patent: Jun. 3, 2008

(54) SCANNING LATCHES USING SELECTING ARRAY

(75) Inventors: Andrew Kenneth Martin, Austin, TX (US); Chandler Todd McDowell, Austin, TX (US); Robert Kevin Montoye, Austin, TX (US); Jun Sawada, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 263 days.

(21) Appl. No.: 10/896,505

(22) Filed: Jul. 22, 2004

(65) Prior Publication Data

US 2006/0020863 A1    Jan. 26, 2006

(51) Int. Cl.
*G01R 31/28* (2006.01)
(52) U.S. Cl. .................. 714/726; 714/730; 714/731; 327/142
(58) Field of Classification Search .................. None
See application file for complete search history.

(56) References Cited

U.S. PATENT DOCUMENTS

| | | | | |
|---|---|---|---|---|
| 3,783,254 A * | 1/1974 | Eichelberger | ............... | 708/100 |
| 4,493,077 A * | 1/1985 | Agrawal et al. | ............ | 714/731 |
| 4,503,386 A * | 3/1985 | DasGupta et al. | .......... | 714/731 |
| 4,581,738 A * | 4/1986 | Miller et al. | .................. | 714/31 |
| 4,613,970 A * | 9/1986 | Masuda et al. | ............. | 714/726 |
| 5,428,574 A * | 6/1995 | Kuo et al. | .................. | 365/201 |
| 5,671,182 A * | 9/1997 | Yin | ....................... | 365/189.05 |
| 5,784,383 A * | 7/1998 | Meaney | ...................... | 714/732 |
| 5,914,699 A * | 6/1999 | Imamura | ..................... | 345/99 |
| 6,028,983 A * | 2/2000 | Jaber | .......................... | 714/30 |
| 6,262,939 B1 * | 7/2001 | Matsui | ....................... | 365/233 |
| 6,856,308 B2 * | 2/2005 | Akimoto et al. | .............. | 345/98 |

\* cited by examiner

*Primary Examiner*—Jacques Louis-Jacques
*Assistant Examiner*—Guerrier Merant
(74) *Attorney, Agent, or Firm*—Casimer K. Salys; Dillon & Yudell LLP (57) ABSTRACT

A method and system for scanning data from a specific latch in a matrix array of latches. The matrix array is made up of vertical selector lines and horizontal data lines. Each latch is coupled at an intersection of a selector line and a data line by a transistor. By turning on the transistor, the contents of the latch can be selectively read or written to.

7 Claims, 8 Drawing Sheets

SCANNING LATCHES USING SELECTING ARRAY

CROSS-REFERENCE TO RELATED APPLICATIONS

The present application is related to co-pending U.S. patent application Ser. No. 10/670,832, filed on 25 Sep. 2003, and incorporated herein by reference in its entirety.

TECHNICAL FIELD

The present invention relates in general to the field of computers, and in particular to the observation and manipulation of data in state holding elements. Still more particularly, the present invention relates to a method and system for reading and writing latch data by selecting a specific latch through the use of a line selector.

DESCRIPTION OF THE RELATED ART

Figure 1A:
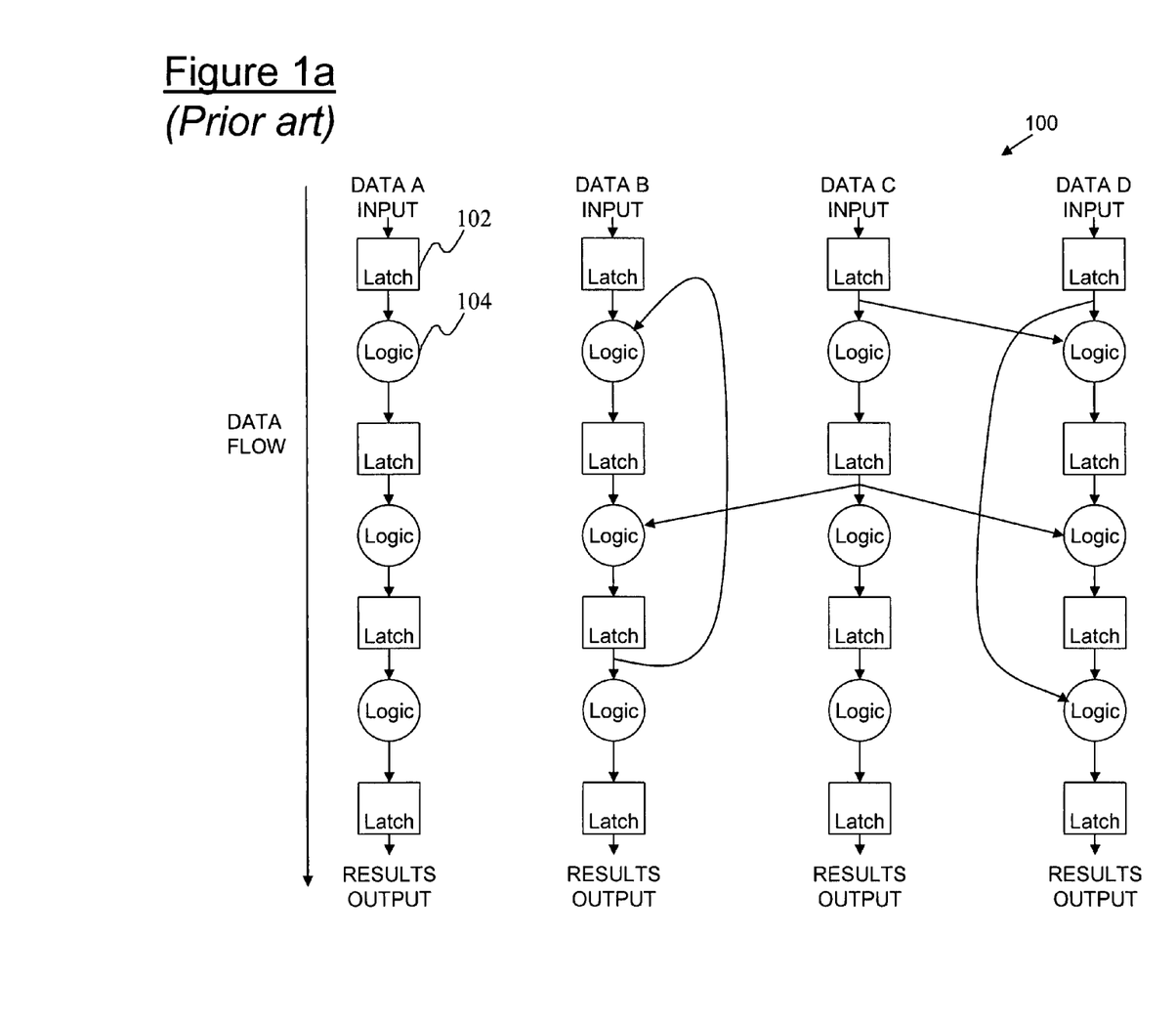
FIG. 1a depicts a prior art logic/latch array of state holding elements and processing logic.

Computing processor logic is typically made up of multiple clusters of combinatorial logic (hereinafter referred to as "logic") and data latches. The logic executes machine instructions to manipulate data, and the data latches store data, including input data being input into logic as well as output data being output from the logic after manipulation. A typical collection of logic and latches is shown in FIG. 1a as logic/latch array 100.

Logic/latch array 100 is made up of multiple state holding elements 102 (typically latches) and logics 104. Data bits are input into the top state holding elements 102 where the data bits are latched, and at a subsequent clock cycle are applied to one or more logics 104. The results of the operations of the logics 104 are then outputted to one or more other state holding elements 102, and so on until the final results are outputted at the bottom of the logic/latch array 100. A chip is composed of many such blocks of logic and latches.

A common desire when a chip is manufactured is to test whether there are any defects in the manufacturing process that may cause the chip to function differently from that which would result from defect free manufacturing. A test program of data bits ("test vectors") inputted into the top of logic/latch array 100 will output known predicted results ("result vectors") from the bottom of the logic/latch array 100 after a known number of clock cycles if the logic/latch array 100 is working properly. However, for a large block of logic, a prohibitively large number of vectors may be required to determine if the logic/latch block is suitably free from defects. Additionally, the existence of feedback and jumps of data as shown by the arrows in FIG. 1a may increase the number of vectors required to detect all manufacturing defects, or may make it impossible to detect certain detects. One solution to the problem of having a large number of vectors is to independently check smaller portions of the logic block. This can be accomplished by setting the state of the internal latches, clocking the system, and reading the results from the latches. By checking the sub-functions between the latches, much smaller numbers of test vectors can be used to gain higher coverage of the faults.

Thus, to check the accuracy of the operation of logic/latch array 100, interim contents, resulting from operations performed by logics 102, of state holding elements 102 are scanned out and inspected. Checking such intermediate operations and their results utilizes techniques such as Level-Sensitive Scan Design (LSSD) tests, Generalized Scan Design (GSD) tests, or other scan design test techniques that enable testing at all levels of VLSI circuit packaging. The principles of the LSSD technique are described, for example, in U.S. Pat. Nos. 3,783,254, 3,784,907 and 3,961,252, all to Eichelberger and incorporated by reference in their entirety.

Figure 1B:
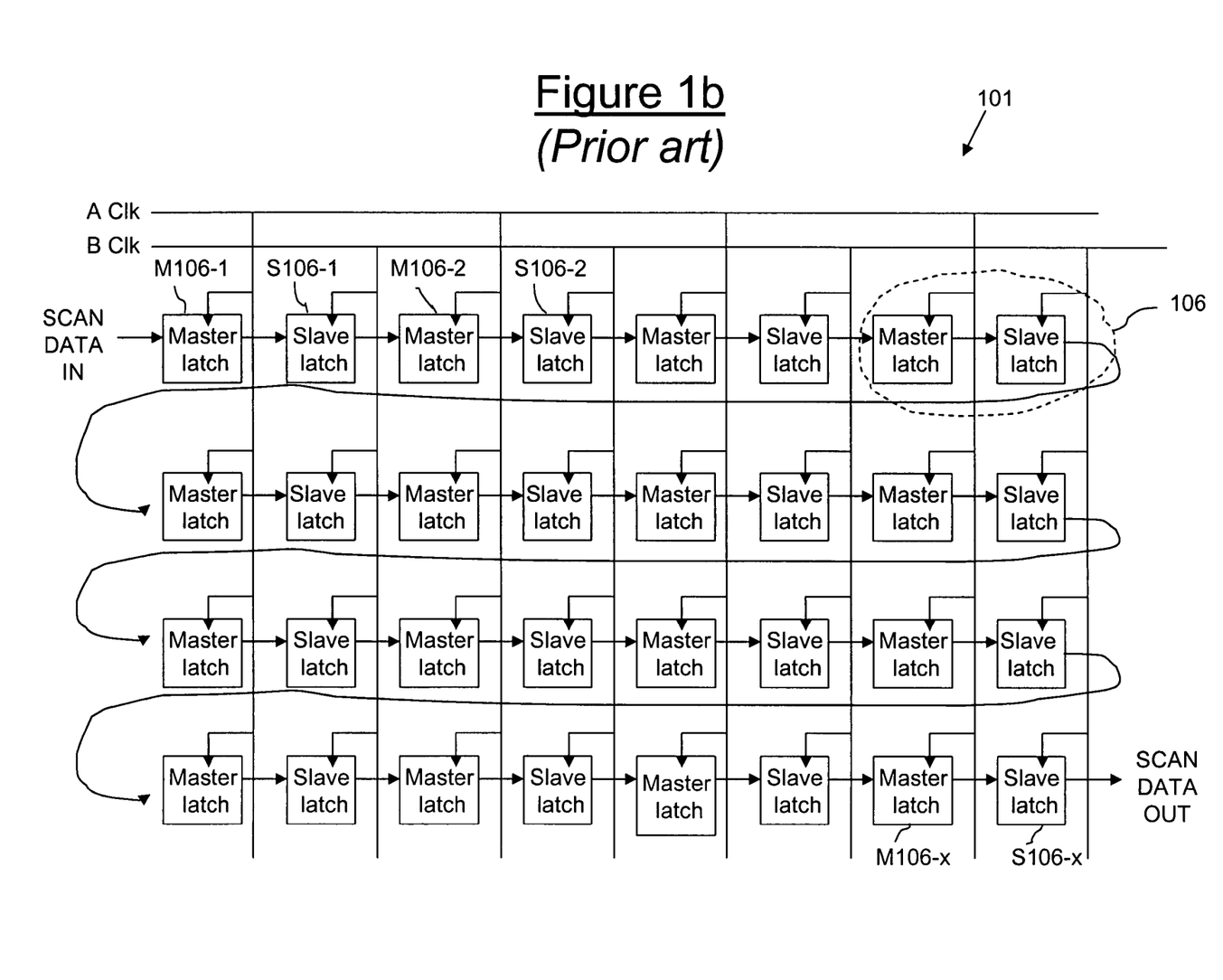
FIG. 1b illustrates a prior art array of state holding elements having data sequentially scanned out.

FIG. 1b illustrates latch pairs 106, analogous to the state holding elements 102 shown in FIG. 1a, that are used for scanning data out of a latch array 101. Latch pairs 106 hold intermediate results of operations performed by logics 104 as described above. (For purposes of clarity, FIG. 1b omits representations of logics 104 shown and described in FIG. 1a.) To facilitate trustworthy scans, each latch pair 106 illustrated in FIG. 1b includes a master latch M106 and a slave latch S106. The slave latches S106 are necessary to ensure that data is not lost through timing mishaps that could occur if data bits were to be passed directly from a first master latch to a second master latch.

During a scan-out process, a data bit in a first master latch is first moved to a first slave latch, which then passes the data bit to a second master latch, which then passes the data bit to a second slave latch, and so on until the data bit safely passes through the entire latch array 101. As depicted in FIG. 1b, the latch array 101 of master latches M106 and slave latches S106 is under the clocking control of a first clock (A_clk) for the master latches M106 and a second clock (B_clk) for the slave latches S106. Thus, when a scan-out operation is performed, the data bits are scanned out in a serial manner as depicted, wherein the data bit in master latch M106-1 moves to slave latch S106-1, which passes the data bit to master latch M106-2, which passes the data bit to slave latch S106-2, and so on until the data bit is finally read out of latch array 101 through/from slave latch S106-x.

Figure 2:
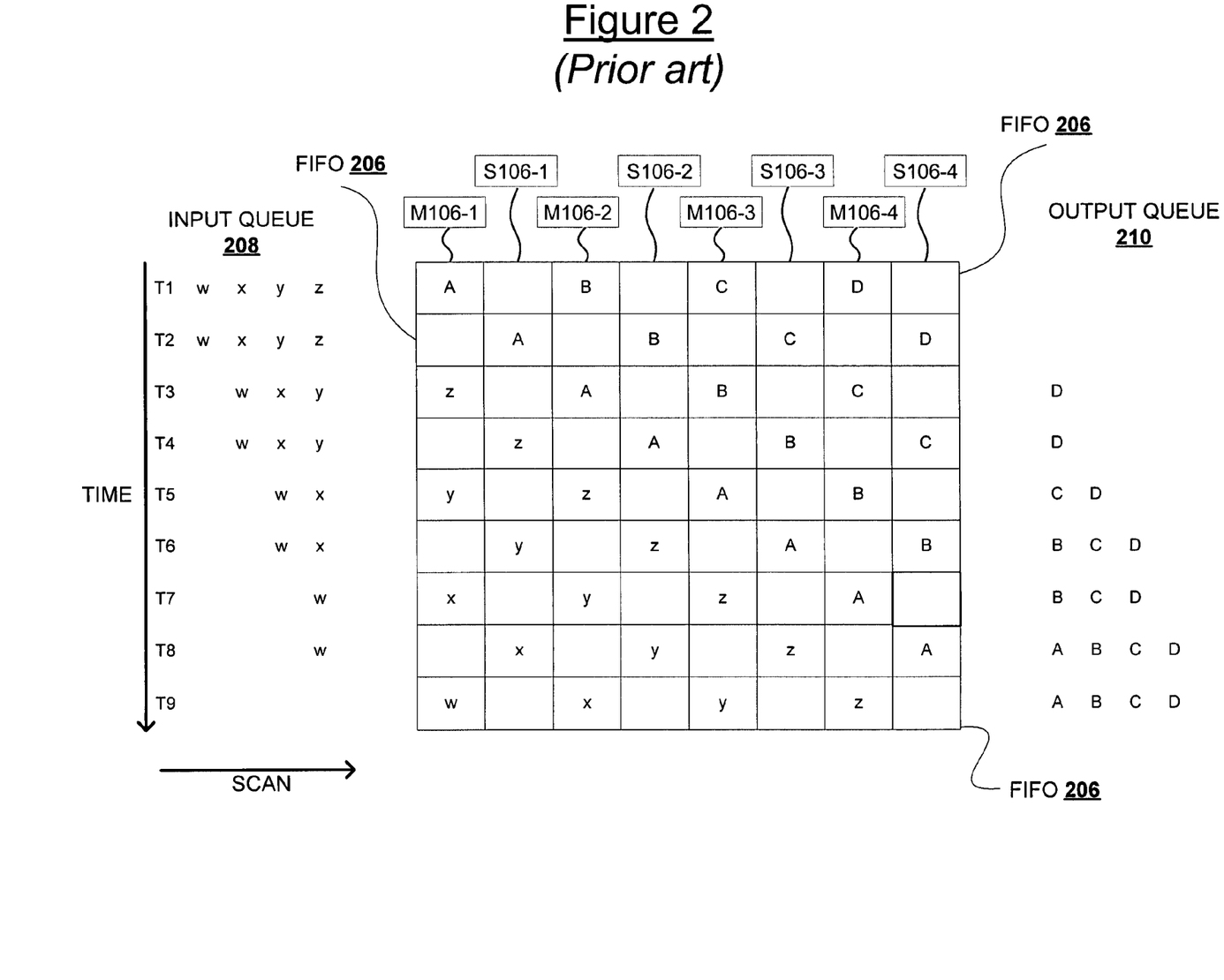
FIG. 2 depicts a single row of state holding elements having data scanned out using prior art master/slave latch pairs.

Referring now to FIG. 2, there is a block diagram of four master/slave latch pairs being scanned. Assume in FIG. 2 that instead of twenty master/slave latch pairs M106/S106, as depicted in FIG. 1b, there are only four master/slave latch pairs M106-1/S106-1 through M106-4/S106-4 in a First-In First Out (FIFO) 206, as depicted. At initial time "T1", input queue 208 holds data elements "w, x, y, z," each master latch M106 holds a significant data bit (such as a result of an intermediate operations performed by some piece of logic), each slave latch S106 is empty or in a "don't care" state, and the output queue 210 is empty (or in a "don't care state). At time "T2", all the data bits are shifted into the available slave latches. Thus, data bit "A" moves from master latch M106-1 to slave latch S106-1, data bit "B" moves from master latch M106-2 to slave latch S106-2, data bit "C" moves from master latch M106-3 to slave latch S106-3, and data bit "D" moves from master latch M106-4 to slave latch S106-4.

Moving on to time "T3", the data bits are shifted into the master latches either from slave latches or from the external queue. In addition a data bit will be shifted to the output queue. So, data bit "z" from input queue 208 shifts into master latch M106-1, data bit "A" advances from slave latch S106-1 into master latch M106-2, data bit "B" advances from slave latch S106-2 into master latch M106-3, data bit "C" advances from slave latch S106-3 into master latch M106-4, and data bit "D" advances from slave latch S106-4 into output queue 210. (Note that input queue 208 and output queue 210 may also have master/slave latch pairs (not shown) as depicted for FIFO 206.)

Continuing along the time line in FIG. 2, significant data bits are continued to be scanned out of FIFO 206 until time "T9", at which time all of the leading data bits (w, x, y, z) originally in input queue 208 are scanned into FIFO 206, and all of the significant data bits (A, B, C, D) are scanned out of FIFO 206 into output queue 210.

One significant limitation of the traditional scan chain described in FIG. 1a-b and FIG. 2 is that all data in the scan chain must be scanned out in a serial manner. Thus, to view a specific scan chain latch, the entire scan chain must be scanned out, and the contents of a specific scan chain latch must be "picked out" as it enters the output queue 210 shown in FIG. 2.

Another limitation of traditional scan chains is that they require the additional slave latches S106 to ensure accurate serial movement through the serial pathway shown in FIG. 1b. Although additional latches are not needed when a logic/latch block stores internal states in master-slave flip-flips, which themselves are pairs of master and slave latches, slave latches S106 are necessary if mid-cycle latches scheme is used, in which data is latched into a first latch on a clock signal rise, and then latched into a second latch on the same clock signal's fall.

Thus, it would be a useful improvement of the prior art to have a system that allows a specific latch to be directly accessed, allowing the examination of the contents of only that specific latch, without adding additional storage elements to the system.

SUMMARY OF THE INVENTION

The present invention is therefore directed to a method and system for directly accessing internal data from a specific latch in a matrix array of latches. The matrix array includes vertical selector lines and horizontal data lines. Each latch is coupled at an intersection of a selector line and a data line by a transistor. By turning on the transistor, the contents of each latch can be selectively accessed.

Each latch in a single column selected by a selector line puts a high or low signal (binary data) on one of the data lines. The data on each of the data lines is then amplified by a sense-amplifier that senses whether the data on each data line is high or low. The data on the data lines is sent to an output buffer, and then to a computer, where the data (i.e., contents of the latches) can be examined.

Alternatively, each latch in a column can be individually accessed using a "write transistor" to write data from a data line to a latch, and a different "read transistor" to read data to the data line from the same latch.

Alternatively, data can be read from particular latches by pre-charging the data lines, and then reading the contents of a column of latches by coupling each latch in the column to a respective data line.

The above, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, where:

DETAILED DESCRIPTION OF A PREFERRED EMBODIMENT

Figure 3A:
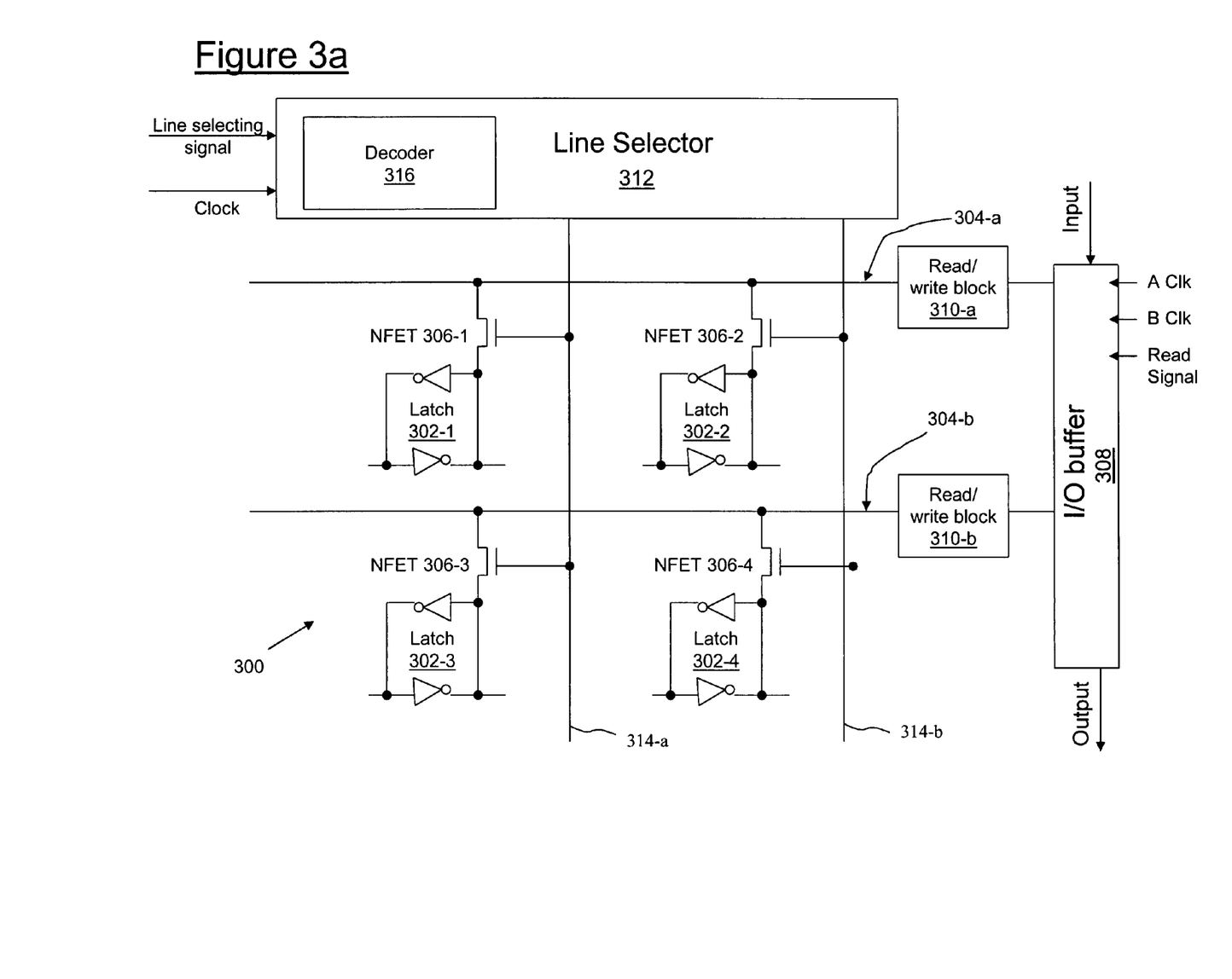
FIG. 3a illustrates a 2×2 matrix of latches that can be read from or written to using a line selector and an input/output (I/O) buffer.

With reference now to FIG. 3a, there is depicted a preferred embodiment of the present invention for reading and writing data from latches. Depicted is a matrix 300, which is a 2×2 matrix of four state holding elements shown in exemplary form as latches 302-1 to 4. Only a 2×2 matrix is shown for purposes of clarity, but it is understood that scan matrix 300 may contain hundreds, thousands, or more latches 302.

Each latch 302 is coupled to a data line 304 via an NFET (N-type Field Effect Transistor). For example, latch 302-1 is coupled to data line 304-a via NFET 306-1. Data lines 304 are coupled to an output scan storage unit shown as an Input/Output (I/O) buffer 308, which is a data buffer for data being written to or read from the latches 302. Consider as an example of usage of the present invention the steps taken to read data from exemplary latch 302-1.

First a read/write block 310-a is switched to a "Read mode" to allow data on data line 304-a to be sensed, and then to amplify that data for transmission to and storage in a specific latch (not shown) in I/O buffer 308. Also, a "Read Signal" is set high in the I/O buffer 308, allowing data from data line 304-a to be stored in a specific latch (not shown) in I/O buffer 308. Additionally, a line selecting signal is received in a line selector 312, which using circuitry shown in detail in FIG. 3b, causes a select line 314-a to go high (positive voltage representing a logic 1), thus turning on NFET 306-1. If latch 302-1 is holding a "0", then a "0" (low voltage) is put on data line 304-a. Conversely, if latch 302-1 is holding a "1", then NFET 306-1 allows a positive voltage charge to be put on data line 304-a. The content of data line 304-a (high or low: "1" or "0") is then sensed and amplified by read/write block 310-a, and that data is then stored in I/O buffer 308.

The latch data copied to the I/O buffer 308 can be read using a normal LSSD scanning technique. That is, by alternatively setting "A Clk" and "B Clk" to high, the data stored in the I/O buffer is read sequentially from the "Output" port of I/O buffer 308. The internal structure of I/O buffer 308 is clear to those skilled in the art of LSSD scan technique.

In order to read all the data stored in all the latches, data can be read column by column. For example, all the latch contents in FIG. 3a can be read by first setting the selector signal 314-a to copy the latch values of latch 302-1 and latch 302-3 into the I/O buffer 308, then transferring the contents of the I/O buffer using the above mentioned technique to an external device such as a computer, then setting the selector signal 314-b to copy the latch values of latch 302-2 and latch 302-4 into the I/O buffer, and then transferring those values from the I/O buffer 308 to the external device.

Figure 3B:
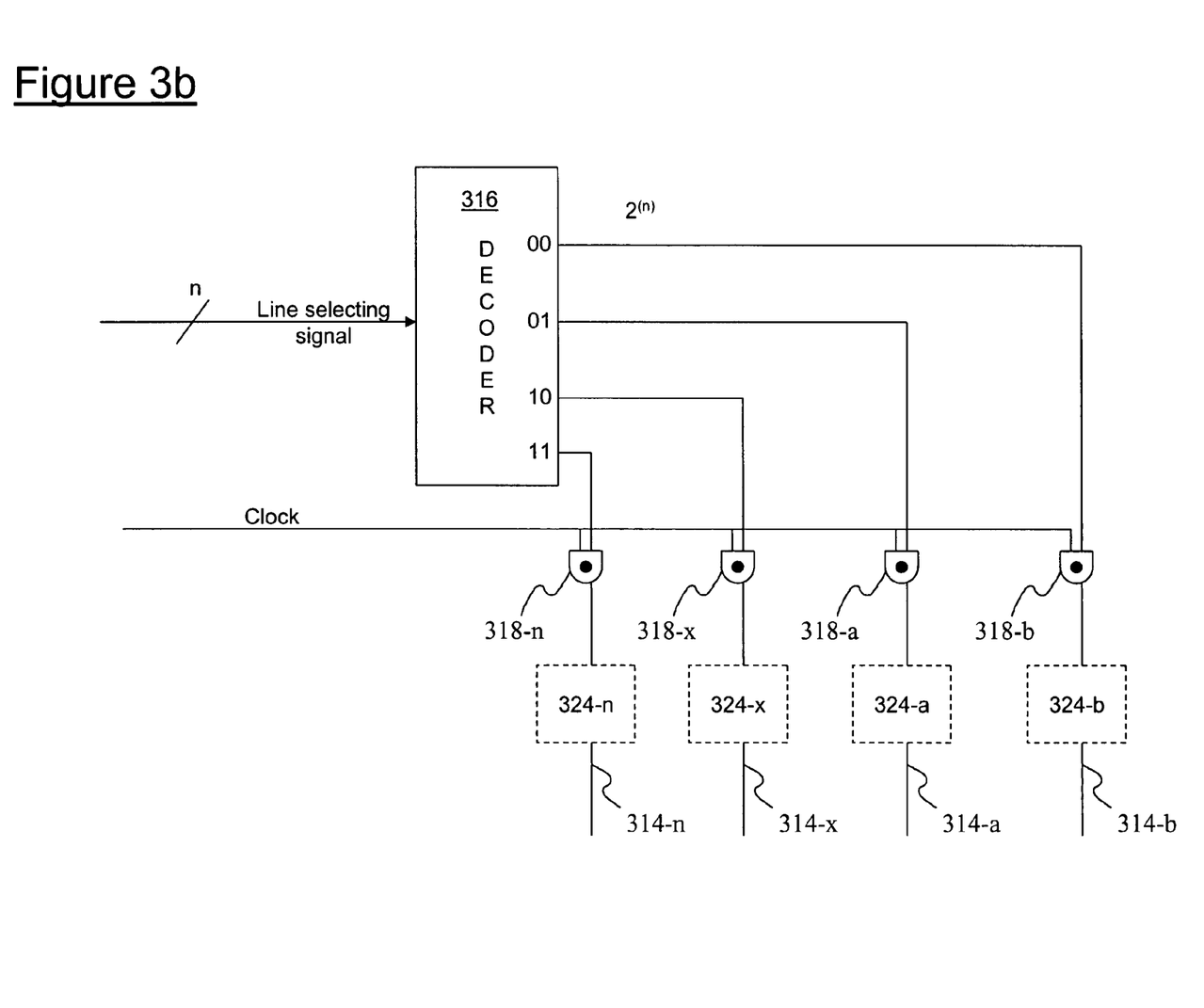
FIG. 3b depicts a decoder used by the circuit illustrated in FIG. 3a and FIG. 5 to place a signal on a specified select line.

With reference now to FIG. 3b, additional detail is shown for preferred circuitry used to select a particular select line 314. A decoder 316 in line selector 312 (shown in FIG. 3a) receives a line selecting signal. Decoder 316 is able to take the line selector signal input on "n" input lines to cause one of $2^n$ select lines 314-a, b, x or n to ultimately go high. (Select lines 314 x and n are for other columns of latches 302 that are not shown in FIG. 3a).

Assume that the line selecting signal shown in FIG. 3b is input on two lines (n=2). Using binary math, this allows four binary values (00, 01, 10, 11) to be input and decoded. If the input on the two lines is $01_{bin}$, then output line "01" being input into an AND gate 318-a will be high. If the clock signal is also high, then the output of AND gate 318-a and only 318-a will be high, making select line 314-a the only high select line. (Note that voltage control components 324 are optional, and may be used to control the slew rate of NFETs 306 in a manner described below. If voltage control components 324 are not present, then select lines 314 are output directly from AND gates 318.)

Next, consider steps taken when writing data to exemplary latch 302-1 as shown in FIG. 3a.

First, data to be written is shifted into the I/O buffer by the LSSD scan technique, toggling the A Clk and B Clk. Then, the read/write block 310-a is switched to a "Write mode" to allow the stored data from a latch (not shown) in I/O buffer 308 to be put on data line 304-a. Then, a line selecting signal is received in line selector 312, which using circuitry shown in FIG. 3b, causes select line 314-a to go high (positive voltage representing a logic 1), thus turning on NFET 306-1. The content of data line 304-a is then stored in latch 302-1.

In order to use to use the same NFET 306 to either read or write data to a latch 302, different methods can be used. For the purpose of example, consider reading or writing data to latch 302-1. One method of selectively reading or writing this data is to vary the slew rate of NFET 306-1. By having a slow slew rate (gradually turning NFET 306-1), then the content of latch 302-1 will be allowed to be slowly put on data line 304-a, preventing the charge in the data line 304-a from disturbing the value in the latch 302-1. Alternatively, by having an high slew rate (quickly turning on NFET 306-1), the charge stored in the data-line suddenly rushes into the latch 302-1, overwriting the data-stored in the latch. The slew rate is controlled by voltage control components 324 shown in FIG. 3b in a manner understood by those skilled in the art of electronics.

Similarly, a threshold voltage level of NFET 306-1 can be manipulated to allow data to be read or written to latch 302-1. If a control voltage on NFET 306-1 is maintained in a middle range (such that NFET 306-1 is only partially turned on), the data in the latch slowly changes the value in the data-line 304-a, resulting in a read operation. Conversely, if the control voltage of NFET 306-1 is such that NFET 306-1 is turned fully on, then the contents of data line 304-a are forced into latch 302-1, resulting in a write operation.

Alternatively, a voltage difference in latch 302-1 and data line 304-a can result in NFET 306-1 being used to permit a write operation to latch 302-1. Thus, using latch 302-1 as an example, assume that the transistors in latch 302-1 are tied to a supply voltage identified as $V_1$. Putting on data line 304-a a voltage $V_2$ that is positively higher that $V_1$ represents a "1" on data line 304-a. Since $V_1$ is much greater (more positive) than $V_2$, then the "1" on data line 304-a will be forced into (written to) latch 302-1. Similarly, putting a voltage $V_3$ on data line 304-a that is much less (more negative) than $V_1$ represents a "0" on data line 304-a. Since $V_3$ is much more negative than $V_1$, then any charge in latch 302-1 will be pushed onto data line 304-a, resulting in a "0" being written to latch 302-1.

The steps for reading or writing to other latches 302 shown in FIG. 3a are the same as described above with respect to latch 302-1.

Figure 4A:
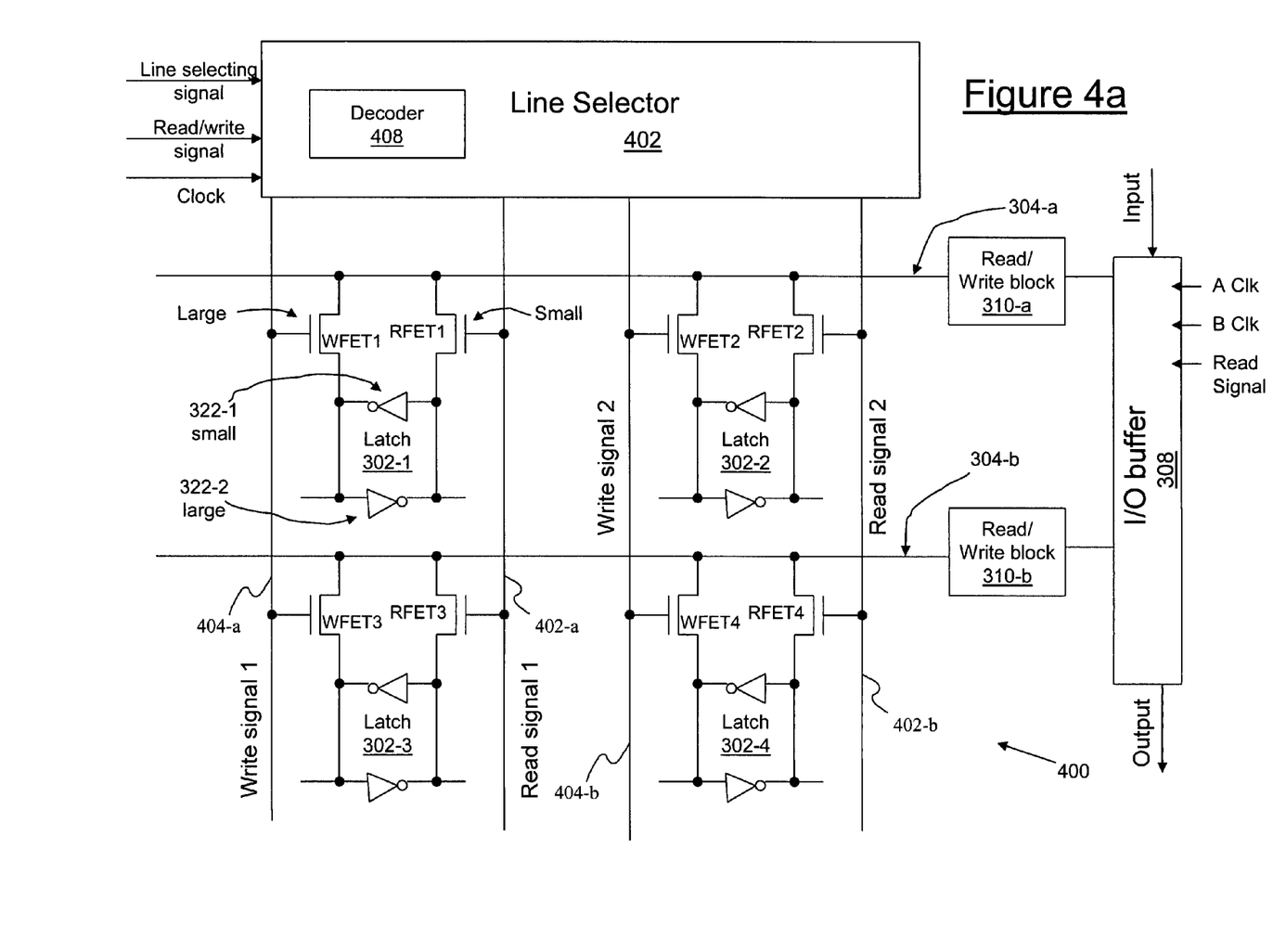
FIG. 4a illustrates a 2×2 matrix of latches that can read and write data to the latches using separate read and write select lines.

With reference now to FIG. 4a, there is illustrated an alternate preferred embodiment of the latch read/write circuitry shown in FIG. 3a. The difference in FIG. 4a is that instead of a same select line 314 regardless of whether data is to be read or written to a latch 302, each column of latches 302 have different read select lines 402 and write select lines 404 that are selected by a line selector 402 having a decoder 408. The read select lines 402 and write select lines 404 are coupled to separate Field Effect Transistors (FETs), identified as Read FETs (RFETs) and Write FETs (WFETs). Thus, the function of the single FETs 306 shown in FIG. 3a is broken out into separate RFETs and WFETs.

The choice of whether a read or write operation is to be performed depends on the value of the Read/Write signal coming into line selector 402. Note that the function of read/write blocks 310 and I/O buffer 308 is similar to that described above for FIG. 3a, and will not be reiterated here.

Preferably, RFETs are small transistors similar to those used in inverter 322-1 small, and the WFETs are large transistors similar to those found in inverters 322-2 large, both inverters making up latch 302-1. Thus, when a WFET is turned on, its brute power allows it to overcome any push-back from inverter 322-1 small, resulting in a write operation to the latch 302-1. Similarly, when an RFET is turned on, it offers little resistance to inverter 322-2 large, resulting in data passing from latch 302-1 to data line 304 for a read operation.

Figure 4B:
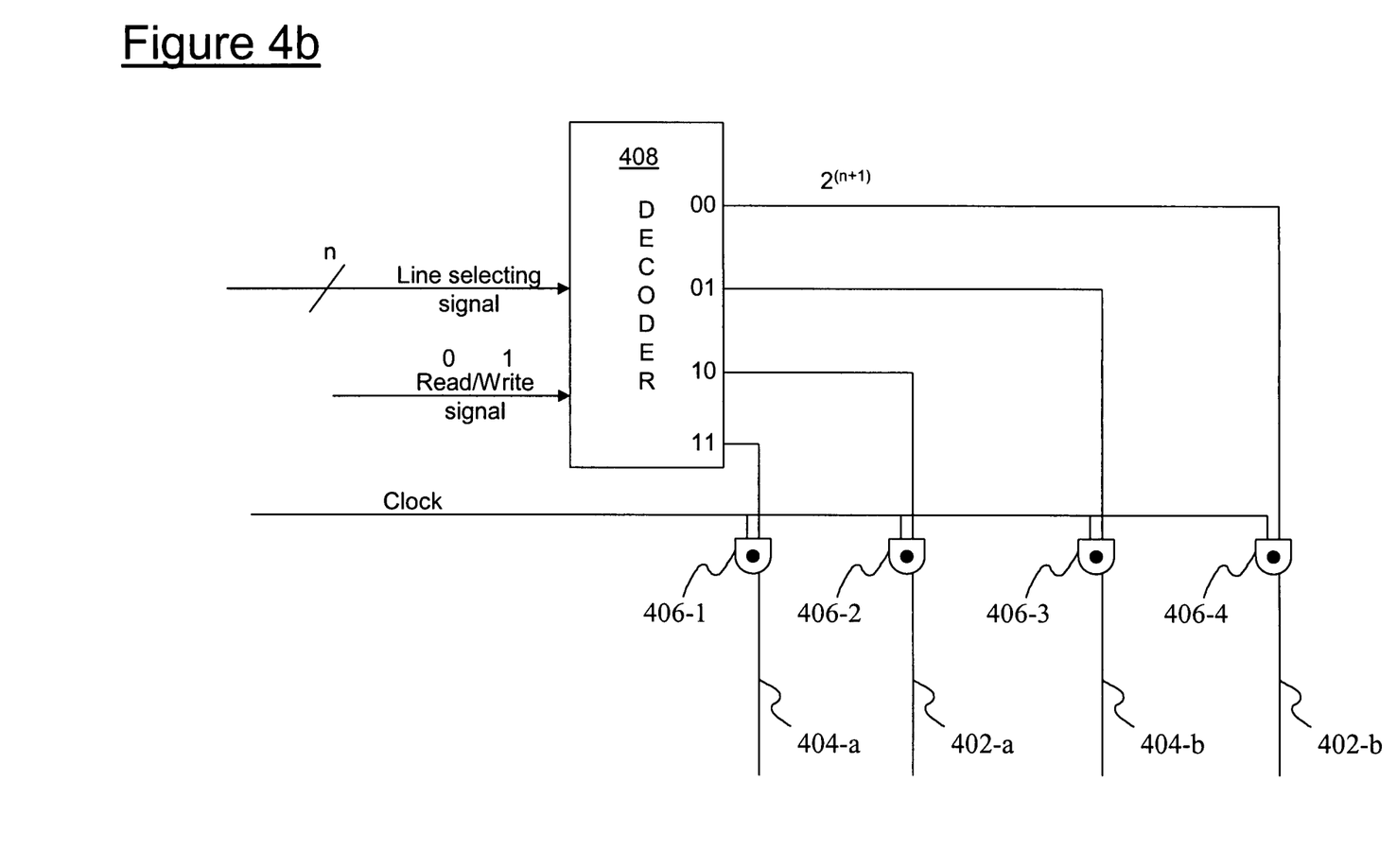
FIG. 4b depicts a decoder used by the circuit illustrated in FIG. 4a to place a signal on a specified select line.

Referring now to FIG. 4b, the selection of a read or write select line depends on the input of the line selecting signal as well as the Read/Write signal coming into the decoder 408. Consider as an example the events that occur if data is to be read from latch 302-1. Assume that line selecting signal is on a single line (n=1). Assume also that a signal of "0" on the Read/Write signal means "read," and a signal of "1" on the Read/Write signal means "write." To put read select line 402-a high, then the input on the single line selecting signal is "1, " and the input on the read/write signal is "0." These inputs cause the line corresponding to the "10" output to go high. The line from the "10" output is logically ANDed with a high clock signal in AND gate 406-2 to produce a high signal on read select line 402-a. Similarly, if data is to be written from latch 302-1, then a signal of "1" is input as the line selecting signal, and a signal of "1" is input as the Read/Write signal, thus causing the line from the output labeled "11" to go high. When this line is logically ANDed with a high clock signal in AND gate 406-1, then write select line 404-a goes high.

While terms such as "high" and "low" have been used in an exemplary manner to describe logical "1" and "0" respectively, it is understood that alternate logical values may be used by altering circuitry (such as substituting PFETs for NFETs) to achieve a same logical result. Likewise, the AND gates 318 and 406, shown respectively in FIGS. 3b and 4b, may be NAND, OR, NOR or other logical units with minimal alteration of the circuitry.

Figure 5:
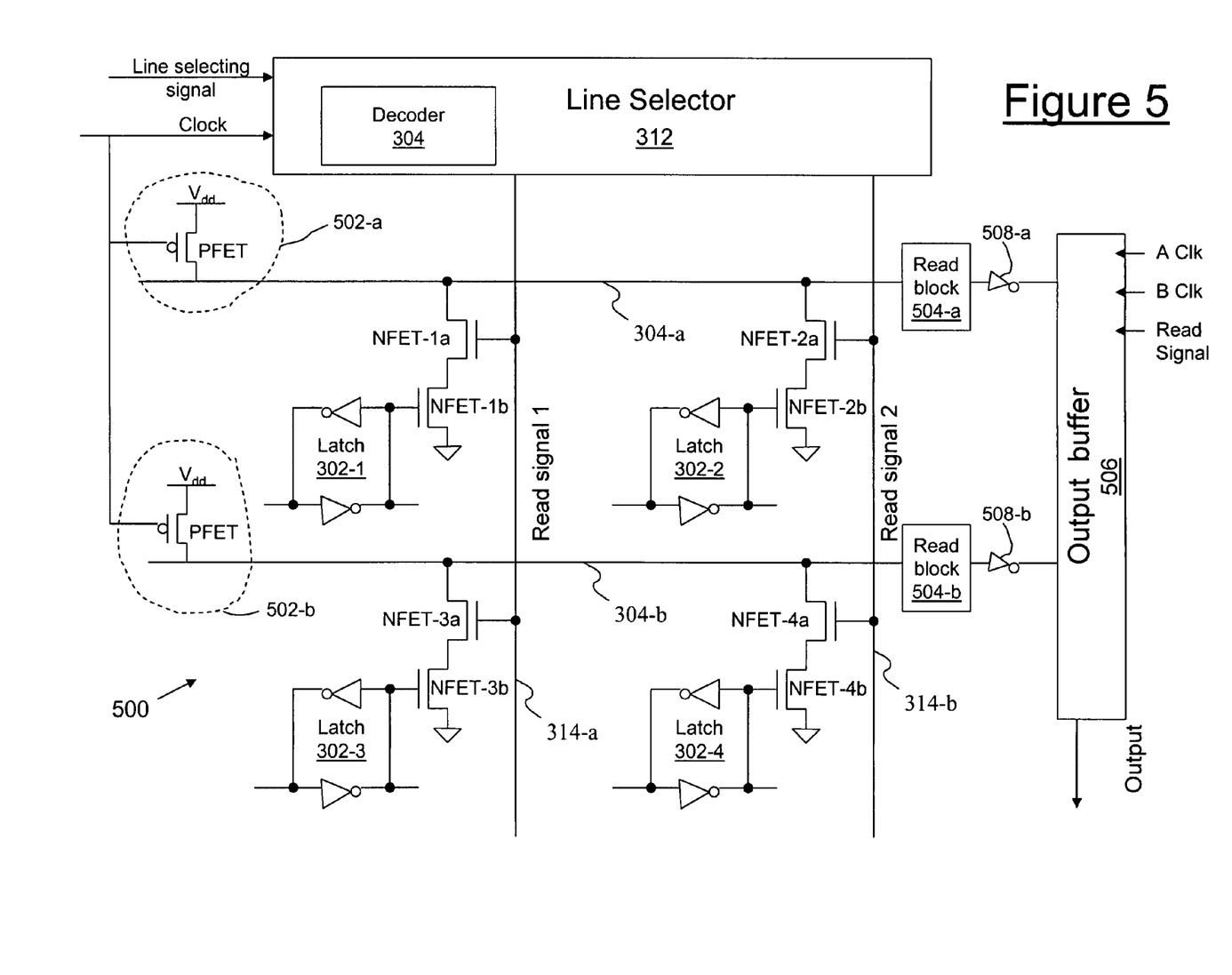
FIG. 5 illustrates a 2×2 matrix of latches that can read data from latches using data line pre-chargers.

Referring now to FIG. 5, a matrix 500 is depicted that is similar to matrix 300 depicted in FIG. 3a, except that matrix 500 can only read data from latches 302. Data is read from pre-charged data lines 304, which are pre-charged using pre-chargers 502. Steps taken to read data from latches 302 shown in FIG. 5 are as follows. First, data lines 304 are pre-charged with a "1" signal upon a low clock signal being input into line selector 302 and a PFET in each pre-charger 502. The low signal turns on each PFET, allowing each data line 304 to be coupled to $V_{dd}$. Since line selector 312 uses the same decoder 304 and circuitry described in FIG. 3b, none of the read select lines 314 have a read signal (high) on the line.

When the clock signal then goes high, the PFETs in the pre-chargers 502 are turned off, thus isolating the data lines 304 from $V_{dd}$. After turning on a select line 314, data latched in selected latches 302 is then sensed on a data line 304 and amplified by read blocks 504. The data is then sent to an Output buffer 506.

Consider an example of reading a "0" from latch 302-1. After pre-charging data line 304-a using pre-charger 502-a, a high Read signal "1" is put on select line 314-a. This high signal turns NFET-1a on. Since latch 302-1 is outputting a "0," then NFET-1b (acting as a discharge switch to data line 304-a) is turned off, thus blocking a pathway from data line 304-a to ground. Therefore, data line 304-a will still have a charge, indicative of a "1," which is the inverse of the true content of latch 302-1. Therefore, an inverter 508-a is located between read block 504-a and Output buffer 506, resulting in a correct value of "0" being stored in Output buffer 506. (To rectify the value read out of latch 302-1, the value can alternately be inverted using software.)

Now consider reading a "1" from latch 302-1. After pre-charging data line 304-a using pre-charger 502-a, a high Read signal "1" is put on select line 314-a. As before, this high signal turns NFET-1a on, but now, since latch 302-1 is outputting a "1," then NFET-1b is turned on, thus allowing NFET-1b to act as a discharge switch to discharge data line 304-a. As data line 304-a now has no charge, indicative of a "0," then inverter 508-a (or alternatively, software) inverts this value to a "1," thus representing the true content of latch 302-1.

An advantage of the system shown in FIG. 5 is that there is no "bounce" on data lines 304, and thus the length of data lines 304 is of little or no consequence in the operation of the scan system. A disadvantage of the system shown in FIG. 5, however, is that the charge on data lines 304 must be captured by Output buffer 506 before the charge on the data lines 314 bleeds off from errant pathways. Another, and perhaps more significant, disadvantage is that data can only be read from, and not written to, the latches 302.

While the line selectors 312 in the preceding figures have been depicted using a multiplexer (MUX) decoder 304, alternatively select lines can be set high (or low) using a shift register (not shown). That is, each external scan clock signal going into scan clock generator can result in a different individual select line going high, usually in a sequential manner. Thus, in FIG. 3b, a first external scan clock signal causes select line 314-b to go high, a second external scan clock signal causes select line 314-a to go high, and so on for other select lines 314-x and then 314-n.

Whichever method is used to cause a select line to go high, preferably only a single select line can be set high while all other select lines remain low. This allows a specific column of latches to be selected. When a specific column of latches is selected by a read signal on a select line, the contents of some or all of those latches can be captured by the output buffer.

For purposes of clarity, each state holding element has been described as a latch. Note however that these state holding elements may be any holding element capable of holding scan data. Such state holding elements may be flip-flops, registers, or any other similar state holding element. Further, the state holding elements may simply be a wire, capacitor, or other physical device charged or discharged to reflect a logic state.

Note also that for purposes of clarity, the latches 302 are depicted in 2×2 matrices of horizontal rows and vertical columns. While this orientation is referenced in the specification and associated claims, it is understood that the orientation is not limited by Cartesian directions such as horizontal and vertical or rows and column. Thus, a reference to a "horizontal" array or a "row" is only to distinguish an array of latches 302 in their coupling to a single data line when compared to latches in a "vertical" array or "column" coupled to a single select line. Note also that the 2×2 size of the matrices is for purposes of illustration only, as it is understood that the size of the matrices is preferably much larger than 2×2.

While individual switches are depicted as various FETs (NFETs and PFETs), it is understood that any similar switching device may be used, including BJTs and other similar switches, so long as signal are adjusted accordingly to turn the switches on and off in the manner described above.

The present invention, as described in its preferred embodiment, is thus able to scan data out of latches with greatly increased granularity, including immediately selecting a single latch within a latch matrix (array). Furthermore, since each latch can be directly accessed, the data jam shown in FIG. 2 is also avoided. Note that this data jam can be avoided both in the scan direction as well as the data flow direction, as is also the case of the system and method described in co-pending U.S. patent application Ser. No. 10/670,832.

It should be understood that at least some aspects of the present invention may be implemented in a program product. Programs defining functions on the present invention can be delivered to a data storage system or a computer system via a variety of signal-bearing media, which include, without limitation, non-writable storage media (e.g., CD-ROM), writable storage media (e.g., a floppy diskette, hard disk drive, read/write CD ROM, optical media), and communication media, such as computer and telephone networks including Ethernet. It should be understood, therefore in such single-bearing media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

While the invention has been particularly shown and described with reference to a preferred embodiment, it will be understood by those skilled in the art that various changes in form and detail may be made therein without departing from the spirit and scope of the invention.

What is claimed is:

1. A method for accessing data from multiple latches, the method comprising:
   in a matrix having multiple data flow paths composed of multiple latches having intervening logic circuits, the latches functionally composed of holding devices for logic circuit data, selectively interconnecting latches in different data flow paths of the multiple data flow paths; and
   coupling two or more latches in two or more data flow paths by switching devices, the switching devices being activated by a line selector that activates the switching devices along a column of the matrix, wherein the contents of all latches in the column are output to multiple data lines along rows of the matrix.

2. The method of claim 1, further comprising:

selecting one of the rows of the matrix to access data in the latches in that row.

3. The method of claim 1, further comprising:

coupling an input/output (I/O) buffer to the data line, wherein data read from the latches is transmitted via the data line to the I/O buffer.

4. The method of claim 1, wherein each of the latches is composed of feedback coupled inverters.

5. The method of claim 1, wherein the switching devices are transistors.

6. The method of claim 1, further comprising:

pre-charging each of the data lines with a different pre-charger; and coupling each one of the latches to ground with a separate discharge switch, wherein if a latch holds a first logical value, then the data line that is coupled to that latch is discharged, and wherein if that latch holds a second logical value, then the data line coupled to that latch remains charged.

7. The method of claim 1, further comprising:

coupling at least one read select line and at least one write select line to a line selector;

coupling each latch in the matrix to one of the read select lines via a separate read switch; and coupling each latch in the matrix to one of the write select lines via a separate write switch, wherein the read switch is controlled by one of the read select lines, and the write switch is controlled by one of the write select lines, and wherein data is read from the latch to the data line by closing the read switch while the write switch is open, and wherein data is written from the data line to the latch by closing the write switch while the read switch is open.

* * * * *